(12) United States Patent
Su et al.

(10) Patent No.: US 9,196,795 B2
(45) Date of Patent: Nov. 24, 2015

(54) FORMATION OF GROUP III-V MATERIAL LAYERS ON PATTERNED SUBSTRATES

(71) Applicants: Jie Su, Santa Clara, CA (US); Tuoh-Bin Ng, San Jose, CA (US); Olga Kryliouk, Sunnyvale, CA (US); Sang Won Kang, San Jose, CA (US); Jie Cui, Albany, CA (US)

(72) Inventors: Jie Su, Santa Clara, CA (US); Tuoh-Bin Ng, San Jose, CA (US); Olga Kryliouk, Sunnyvale, CA (US); Sang Won Kang, San Jose, CA (US); Jie Cui, Albany, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/315,190

(22) Filed: Jun. 25, 2014

(65) Prior Publication Data

US 2014/0367696 A1 Dec. 18, 2014

Related U.S. Application Data

(62) Division of application No. 13/036,261, filed on Feb. 28, 2011, now Pat. No. 8,765,501.

(60) Provisional application No. 61/309,295, filed on Mar. 1, 2010.

(51) Int. Cl.

| | |
|---|---|
| H01L 29/22 | (2006.01) |
| H01L 33/32 | (2010.01) |
| H01L 33/22 | (2010.01) |
| H01L 33/16 | (2010.01) |
| H01L 33/30 | (2010.01) |
| C30B 23/02 | (2006.01) |
| C30B 25/04 | (2006.01) |
| C30B 25/18 | (2006.01) |

(Continued)

(52) U.S. Cl.
CPC ............... *H01L 33/32* (2013.01); *C23C 16/06* (2013.01); *C30B 23/025* (2013.01); *C30B 25/04* (2013.01); *C30B 25/186* (2013.01); *C30B 29/406* (2013.01); *H01L 21/0237* (2013.01); *H01L 21/0242* (2013.01); *H01L 21/0243* (2013.01); *H01L 21/0254* (2013.01); *H01L 33/0066* (2013.01); *H01L 33/16* (2013.01); *H01L 33/20* (2013.01); *H01L 33/22* (2013.01); *H01L 33/30* (2013.01); *H01L 33/007* (2013.01)

(58) Field of Classification Search
CPC . H01L 33/0062; H01L 33/0075; H01L 33/16; H01L 33/22; H01L 33/30; H01L 33/32
USPC .......... 438/22, 29, 39, 41, 42, 44; 257/94–97, 257/103, 615
See application file for complete search history.

(56) References Cited

U.S. PATENT DOCUMENTS

| | | | |
|---|---|---|---|
| 6,692,568 B2 | 2/2004 | Cuomo et al. | |
| 8,133,803 B2 | 3/2012 | Cheng et al. | |
| 8,507,304 B2 | 8/2013 | Kryliouk et al. | |
| 2007/0085093 A1* | 4/2007 | Ohmae et al. | 257/89 |

(Continued)

FOREIGN PATENT DOCUMENTS

JP 2001-257166 9/2001

OTHER PUBLICATIONS

Non-Final Office Action from U.S. Appl. No. 13/036,261 mailed Oct. 10, 2013, 8 pgs.

*Primary Examiner* — Matthew E Warren
(74) *Attorney, Agent, or Firm* — Blakely Sokoloff Taylor Zafman LLP

(57) ABSTRACT

Methods of epitaxy of gallium nitride, and other such related films, and light emitting diodes on patterned sapphire substrates, and other such related substrates, are described.

5 Claims, 13 Drawing Sheets

(51) Int. Cl.
*C30B 29/40* (2006.01)
*H01L 21/02* (2006.01)
*C23C 16/06* (2006.01)
*H01L 33/20* (2010.01)
*H01L 33/00* (2010.01)

(56) References Cited

U.S. PATENT DOCUMENTS

2008/0121903 A1 5/2008 Hiramatsu et al.
2008/0303042 A1 12/2008 Minato et al.

* cited by examiner (a) EL map (b) EL Power map (c) PL Intensity map (a) EL map (b) EL Power map

FORMATION OF GROUP III-V MATERIAL LAYERS ON PATTERNED SUBSTRATES

CROSS-REFERENCE TO RELATED APPLICATIONS

This application is a divisional of U.S. patent application Ser. No. 13/036,261, filed Feb. 28, 2011, which claims the benefit of U.S. Provisional Application No. 61/309,295, filed Mar. 1, 2010, the entire contents of which are hereby incorporated by reference herein.

BACKGROUND

1) Field

Embodiments of the present invention pertain to the field of light-emitting diode fabrication and, in particular, to methods of epitaxy of gallium nitride and light emitting diodes on patterned sapphire substrates.

2) Description of Related Art

Group III-V materials are playing an ever increasing role in the semiconductor and related, e.g. light-emitting diode (LED), industries. Often, group III-V materials are difficult to grow or deposit without the formation of defects or cracks. For example, crack-free growth of select films, e.g. gallium nitride film, is not straightforward in many applications. Also, high quality surface preservation of select films, e.g. a gallium nitride film, is also not straightforward in many applications. The inclusion of one or more buffer layers between a substrate and a device layer has been one approach receiving much recent attention. However, group III-V materials are often sensitive to ambient conditions and care must be taken to avoid such conditions at particular periods of the fabrication process. Avoiding interaction of a sensitive group III-V film with potential damaging conditions, however, can pose many challenges.

DETAILED DESCRIPTION

Figure 1:
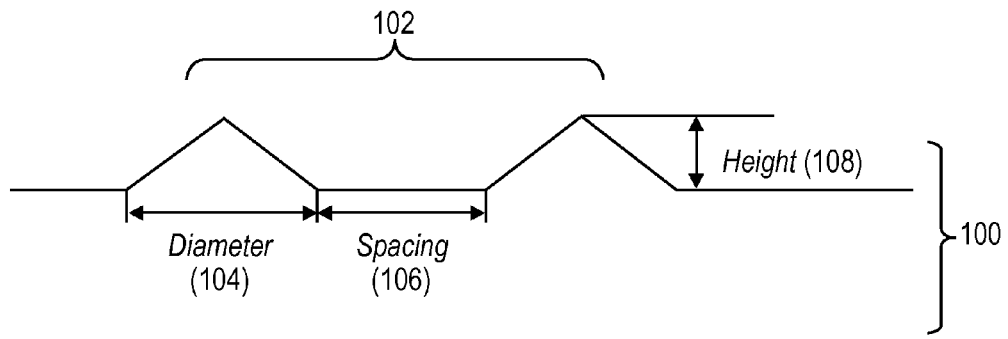
FIG. 1 illustrates a cross-sectional view of a substrate surface pattern for epitaxy of gallium nitride, and other such related films, and light emitting diodes on a patterned substrate, in accordance with an embodiment of the present invention.

Methods of epitaxy of gallium nitride, and other such related films, and light emitting diodes on patterned sapphire substrates, and other such related substrates, are described. In the following description, numerous specific details are set forth, such as fabrication conditions and material regimes, in order to provide a thorough understanding of embodiments of the present invention. It will be apparent to one skilled in the art that embodiments of the present invention may be practiced without these specific details. In other instances, well-known features, such as facility layouts or specific tool configurations, are not described in detail in order to not unnecessarily obscure embodiments of the present invention. Furthermore, it is to be understood that the various embodiments shown in the Figures are illustrative representations and are not necessarily drawn to scale. Additionally, other arrangements and configurations may not be explicitly disclosed in embodiments herein, but are still considered to be within the spirit and scope of the invention.

Disclosed herein are methods of epitaxy of gallium nitride, and other such related films, and light emitting diodes on patterned sapphire substrates, and other such related substrates. In one embodiment, a pit free, high mobility, and improved crystal quality gallium nitride layer is formed on a patterned sapphire substrate.

Also described herein is a pit free, high mobility, and improved crystal group III-V layer disposed on a patterned substrate. In one embodiment, the substrate is a sapphire substrate and the group III-V layer is a gallium nitride layer.

At least some embodiments of the present invention relate to the epitaxy of a pit free, high mobility, and improved crystal quality gallium nitride layer on a patterned sapphire substrate, wherein growth of the gallium nitride layer is carried out to enhance the lateral growth direction after nucleation. Growth may be carried out using deposition methods including metal-organic chemical vapor deposition (MOCVD), hydride vapor deposition (HVPE), or molecular beam epitaxy (MBE).

In accordance with an embodiment of the present invention, patterned sapphire substrates (PSS) are used to grow gallium nitride (GaN)-based light emitting diodes (LEDs) to improve light extraction efficiency. In one embodiment, by roughening the substrate interface, light interference may be suppressed within the active layers of an LED. Furthermore, the threading dislocation density of GaN layers may be further reduced on the PSS. However, in accordance with an embodiment of the present invention, the growth on PSS is pattern-dependent, and is different from that on the conventional sapphire substrates (CSS). The problems associated with the growth on PSS may include, but are not limited to, pitted layers due to non-coalescence, voids near the substrate interface, and poor process reproducibility.

At least some embodiment of the present invention encompass the following key concepts: (a) metal-organic chemical vapor phase epitaxy (MOCVD), (b) patterned sapphire substrates (PSS), (c) lateral growth, (d) fast recovery, and (e) light emitting diodes (LEDs). Some embodiment of the present invention relate to the epitaxy of pit free, high mobility, and improved crystal quality gallium nitride layer on a patterned sapphire substrate, wherein the growth is carried out to enhance the lateral growth after nucleation. In an embodiment, the growth can be carried out using deposition methods such as, but not limited to, metal-organic chemical vapor deposition (MOCVD), hydride vapor deposition (HVPE), and molecular beam epitaxy (MBE).

In accordance with an embodiment of the present invention, a method of growth of GaN on PSS with enhanced lateral growth immediately following formation of a nucleation layer is provided. As a result, in one embodiment, GaN layers grown on PSS exhibit a pit-free smooth surface, high mobility (>500 cm2/V·s) with excellent crystal quality (both FWHM of (002) and (102) rocking curve <260 arc sec). In one embodiment, the LEDs grown subsequently on top of the improved nitride layers with PSS show significant improvement in PL intensity, EL radiometric power, and lower reverse leakage current.

The pattern of a patterned substrate may include, but need not be limited to, pyramids or mesas selected from a variety of different shapes, and from a variety of stripes with different size, spacing, and height. FIG. 1 illustrates a cross-sectional view of a substrate surface pattern for epitaxy of gallium nitride, and other such related films, and light emitting diodes on a patterned substrate, in accordance with an embodiment of the present invention.

Referring to FIG. 1, a patterned surface 102 of a patterned substrate 100 is provided. In accordance with an embodiment of the present invention, one example of a suitable surface patterning is a surface with pyramid shape patterning, as depicted in FIG. 1. In one embodiment, the diameter 104 of each pyramid can range from sub-micron size to tens of microns. In one embodiment, the spacing 106 can also vary and, in a specific embodiment, varies in correlation with diameter 104. In a particular embodiment, the spacing 106 between pyramids is approximately the same as the diameter 104 of an individual pyramid. In an embodiment, the height 108 of each pyramid is in the range of from less than 1 micron to a couple of microns, or even tens of microns.

It is to be understood that the features of the patterned substrate need not be limited to pyramid shapes. In some embodiments, posts formed in the growth substrate are round, triangular, hexagonal, rhombus shape, or other shapes effective for laterally driven growth. In an embodiment, the patterned substrate contains a plurality of features (e.g., posts) having a cone shape. In a particular embodiment, the feature has a conical portion and a base portion. In an embodiment of the present invention, the feature has a tip portion with a sharp point to prevent overgrowth. In an embodiment, the tip has an angle (θ) of less than 145° and ideally less than 110°. Additionally, in an embodiment, the feature has a base portion which forms a substantially 90° angle with respect to the xy plane of the substrate. In an embodiment of the present invention, the feature has a height greater than one micron and ideally greater than 1.5 microns. In an embodiment, the feature has a diameter of approximately 3.0 microns. In an embodiment, the feature has a diameter height ratio of approximately less than 3 and ideally less than 2. In an embodiment, the features (e.g., posts) within a discrete block of features (e.g., within a block of posts) are spaced apart by a spacing of less than 1 micron and typically between 0.7 to 0.8 microns.

In accordance with an embodiment of the present invention, fast lateral growth is promoted along a [112-0] or [101-0] direction after deposition of a nucleation layer. In one embodiment, growth rates along lateral versus vertical directions (with respect to the broadest plane of the surface of the substrate) are modulated by adjusting the growth conditions, which include, but are not limited to, growth temperature, $N_2/H_2$ ratio in a carrier gas, chamber pressure, group VIII precursor ratio, introduction of magnesium (Mg) or silicon (Si) in the vapor phase, etc.

Figure 2:
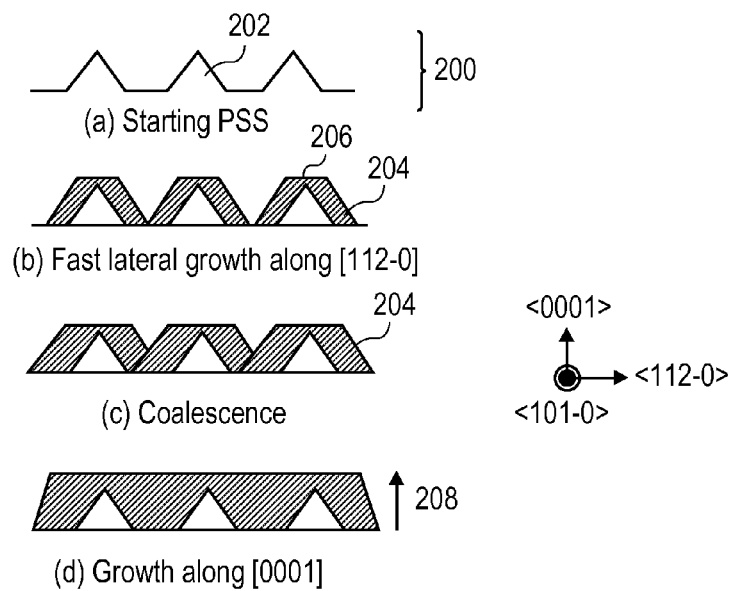
FIG. 2 illustrates cross-sectional views representing a growth evolution of a group III-V film on a substrate patterned with pyramid features, in accordance with an embodiment of the present invention.
Figure 3:
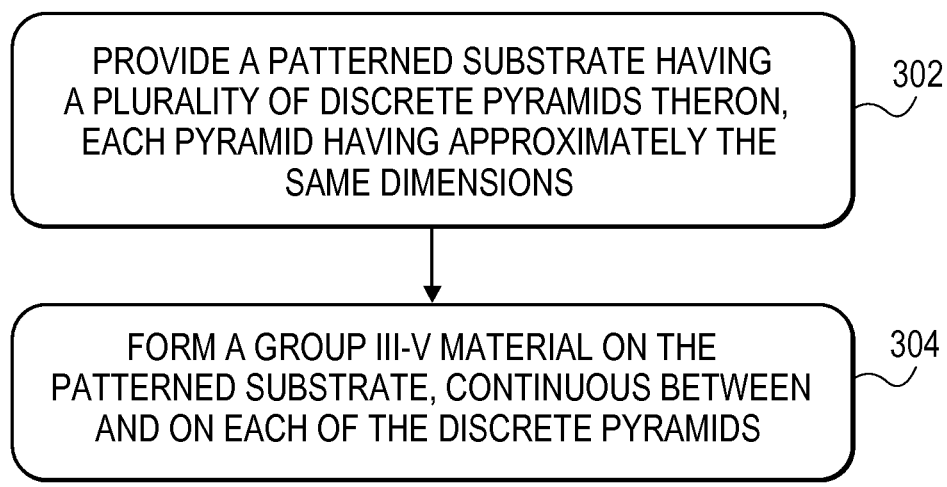
FIG. 3 is a Flowchart representing operations in a method of fabricating a group III-V material on a patterned substrate, in accordance with an embodiment of the present invention.

FIG. 2 illustrates cross-sectional views representing a growth evolution of a group III-V film on a substrate patterned with pyramid features, in accordance with an embodiment of the present invention. FIG. 3 is a Flowchart 300 representing operations in a method of fabricating a group III-V material on a patterned substrate, in accordance with an embodiment of the present invention.

Referring to operation 302 of Flowchart 300, a patterned substrate is provided having a plurality of discrete pyramids thereon, each pyramid having approximately the same dimensions. For example, referring to FIG. 2, growth evolution at different stages on a patterned sapphire substrate 200 is illustrated from the plane of {101-0}. The patterned sapphire substrate 200 has pyramid features 202. Referring to part (a) of FIG. 2, a cross-section of a starting patterned sapphire substrate is depicted.

Referring to operation 304 of Flowchart 300, a group III-V material is formed on the patterned substrate, continuous between and on each of the discrete pyramids. For example, referring to part (b) of FIG. 2, by adjusting the growth conditions, fast growth along the [112-0] or [101-0] direction leads to the rapid coalescence (part (c) of FIG. 2) of adjacent islands 204 of growth material, e.g. of gallium nitride, until the surfaces become flat 206. Referring to part (d) of FIG. 2, following the initial lateral-dominated growth, the growth conditions are switched to promote vertical growth rates along the [0001] direction 208.

Figure 4:
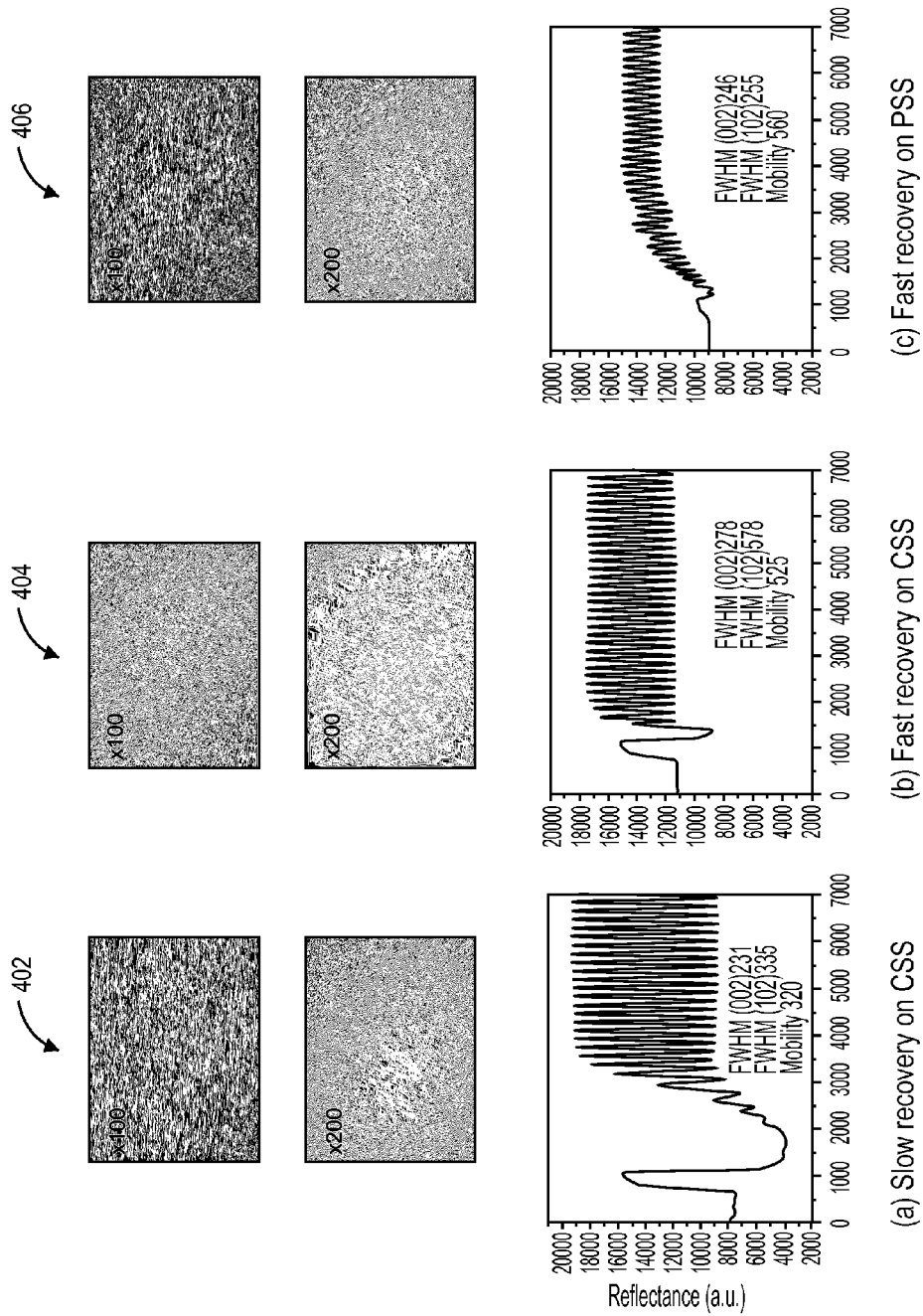
FIG. 4 illustrates surface measurements as well as recovery process times for epitaxy of gallium nitride on a patterned sapphire substrate, via surface morphology and reflectance during growth, in accordance with an embodiment of the present invention.
Figure 5:
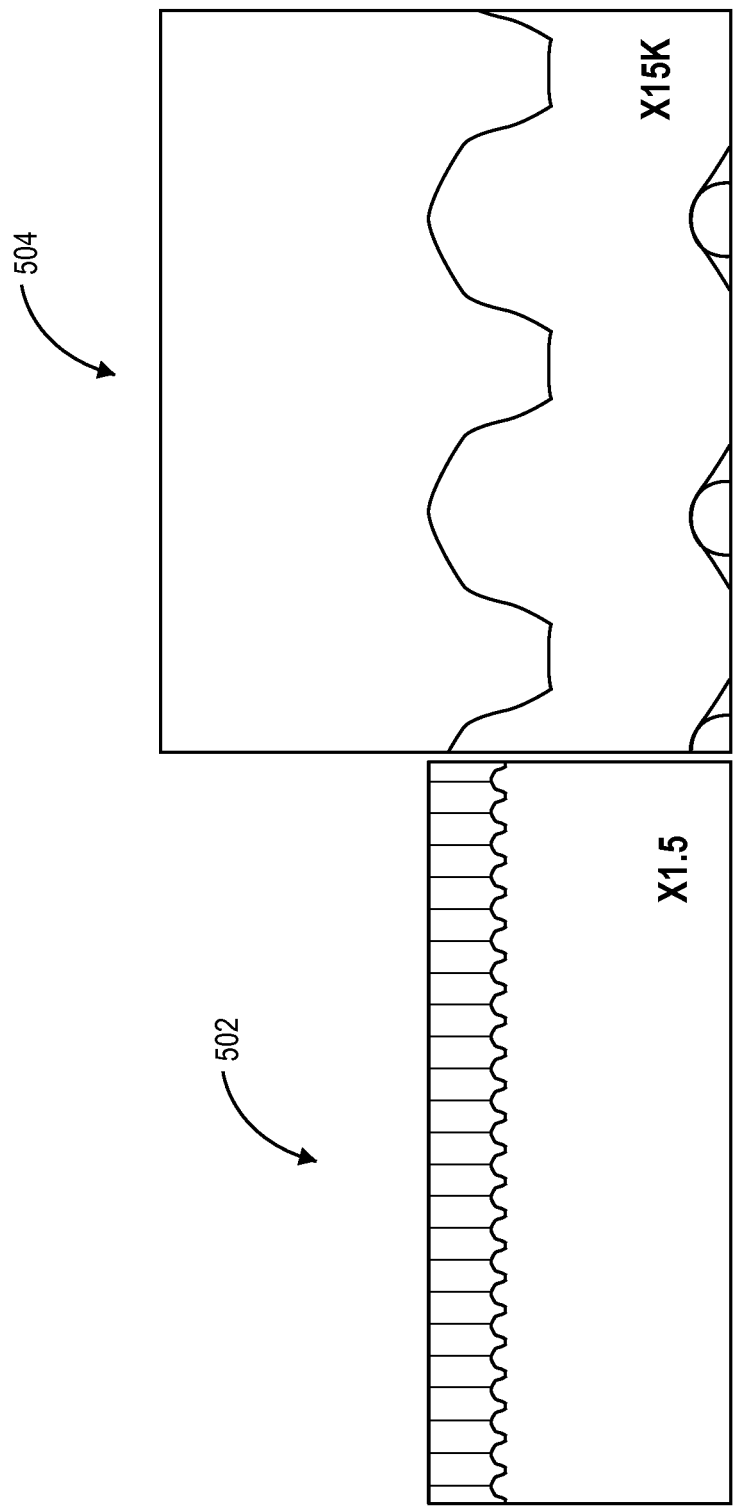
FIG. 5 depicts scanning electron microscope (SEM) images of the cross-sectional view of gallium nitride formed on a patterned sapphire substrate, in accordance with an embodiment of the present invention.
Figure 6A:
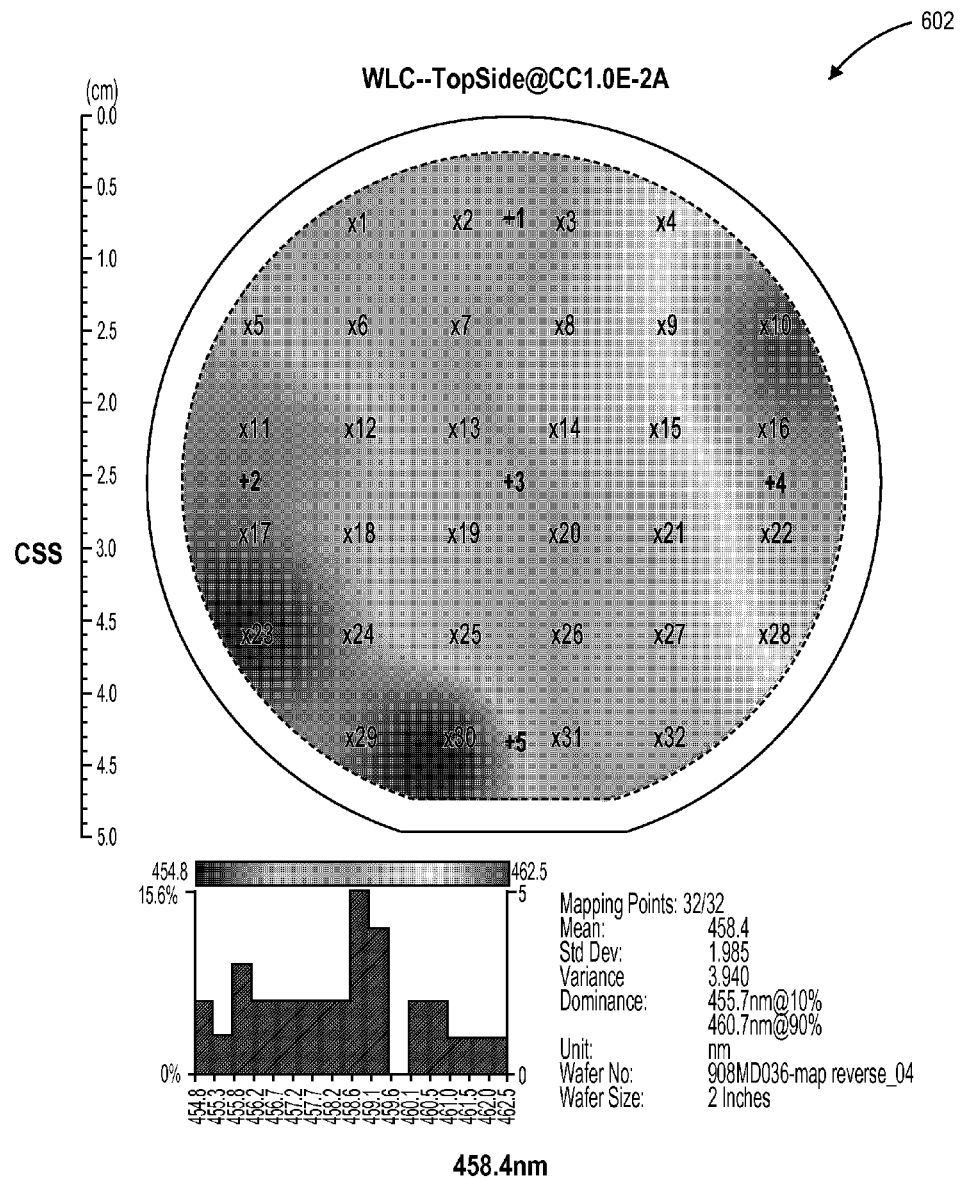
FIGS. 6A-6F depict a comparison of EL and PL for light emitting diodes (LEDs) grown on conventional sapphire substrates (CSS) and patterned sapphire substrates (PSS), in accordance with an embodiment of the present invention.
Figure 6B:
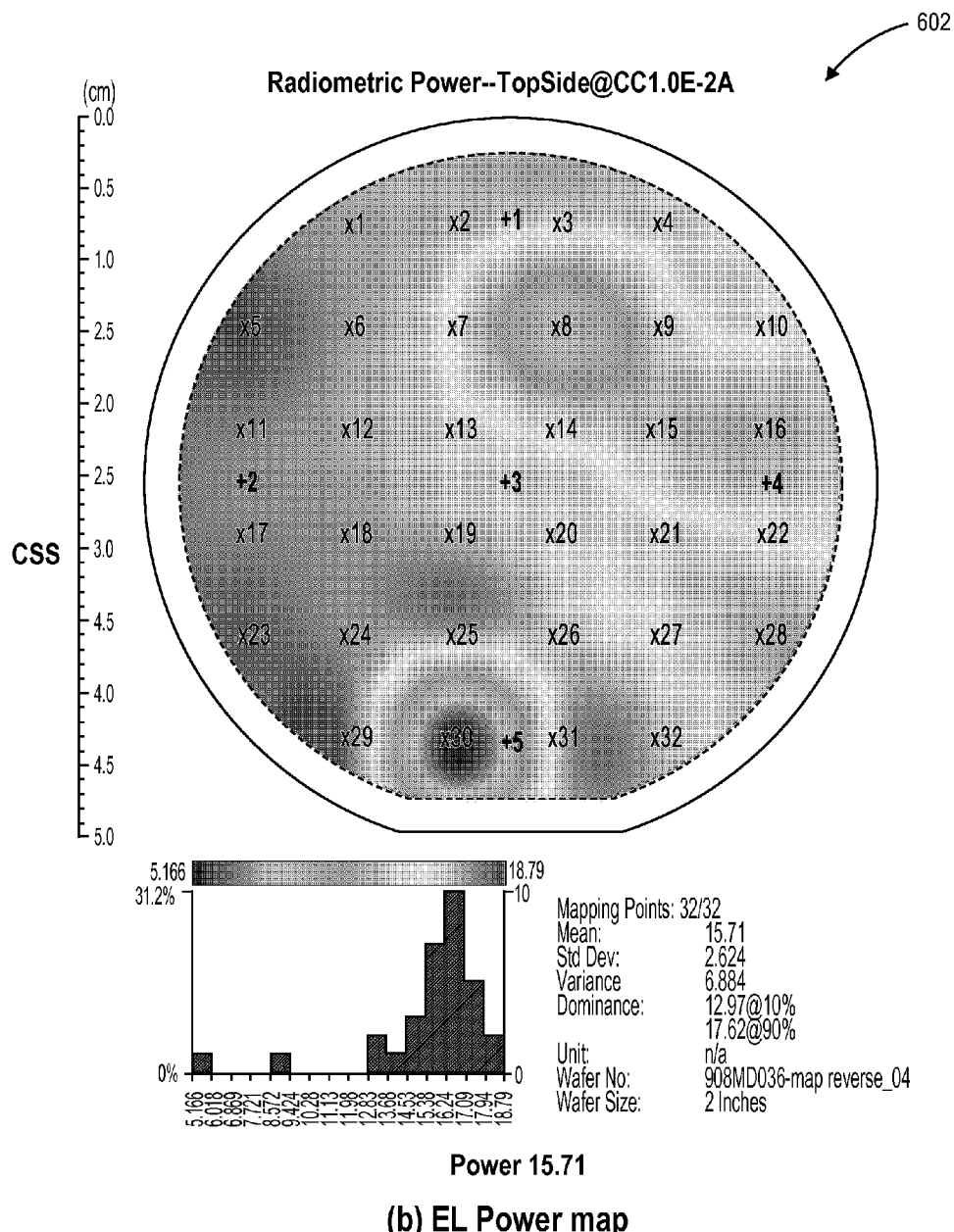
Figure 6C:
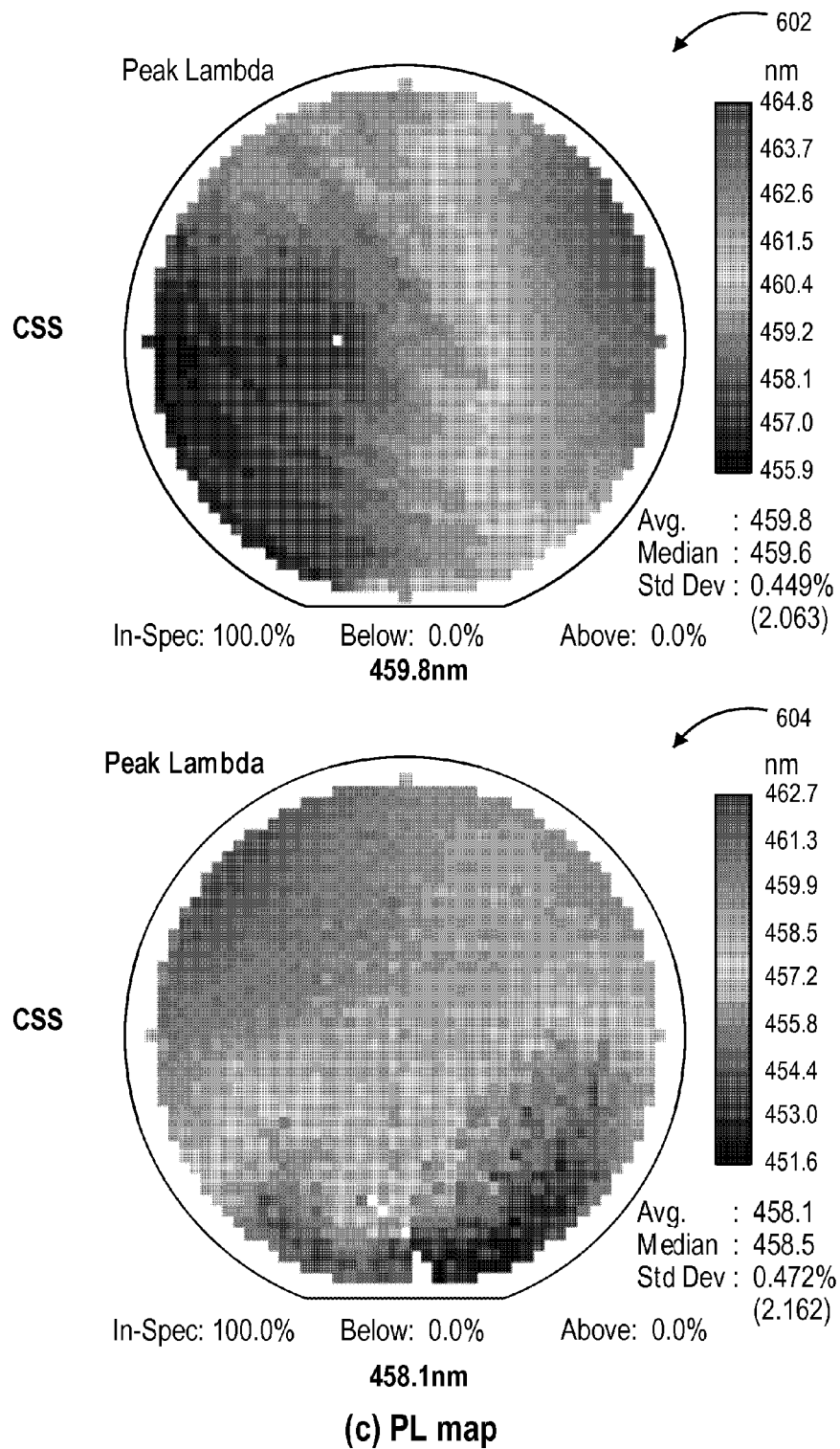
Figure 6D:
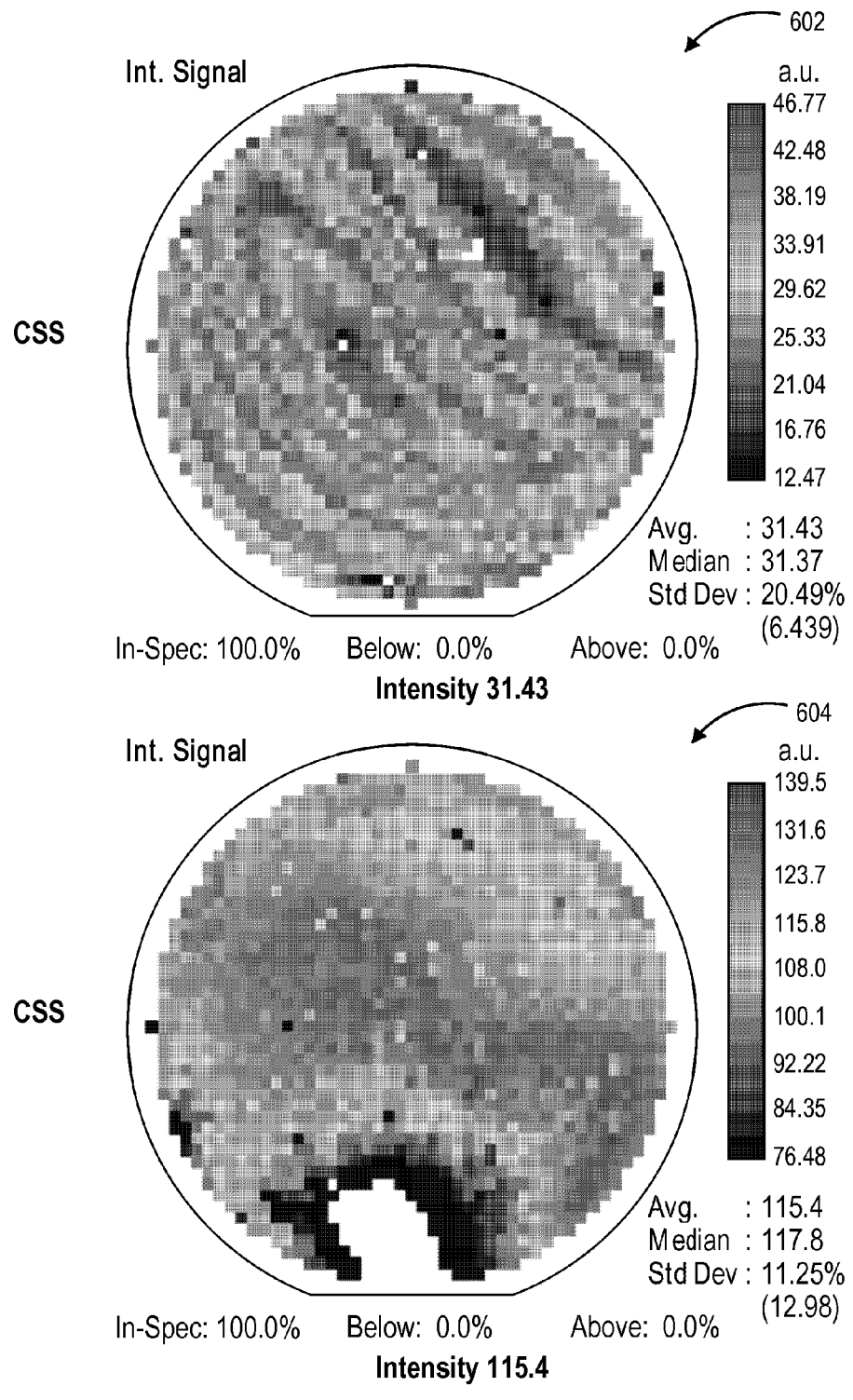
Figure 6E:
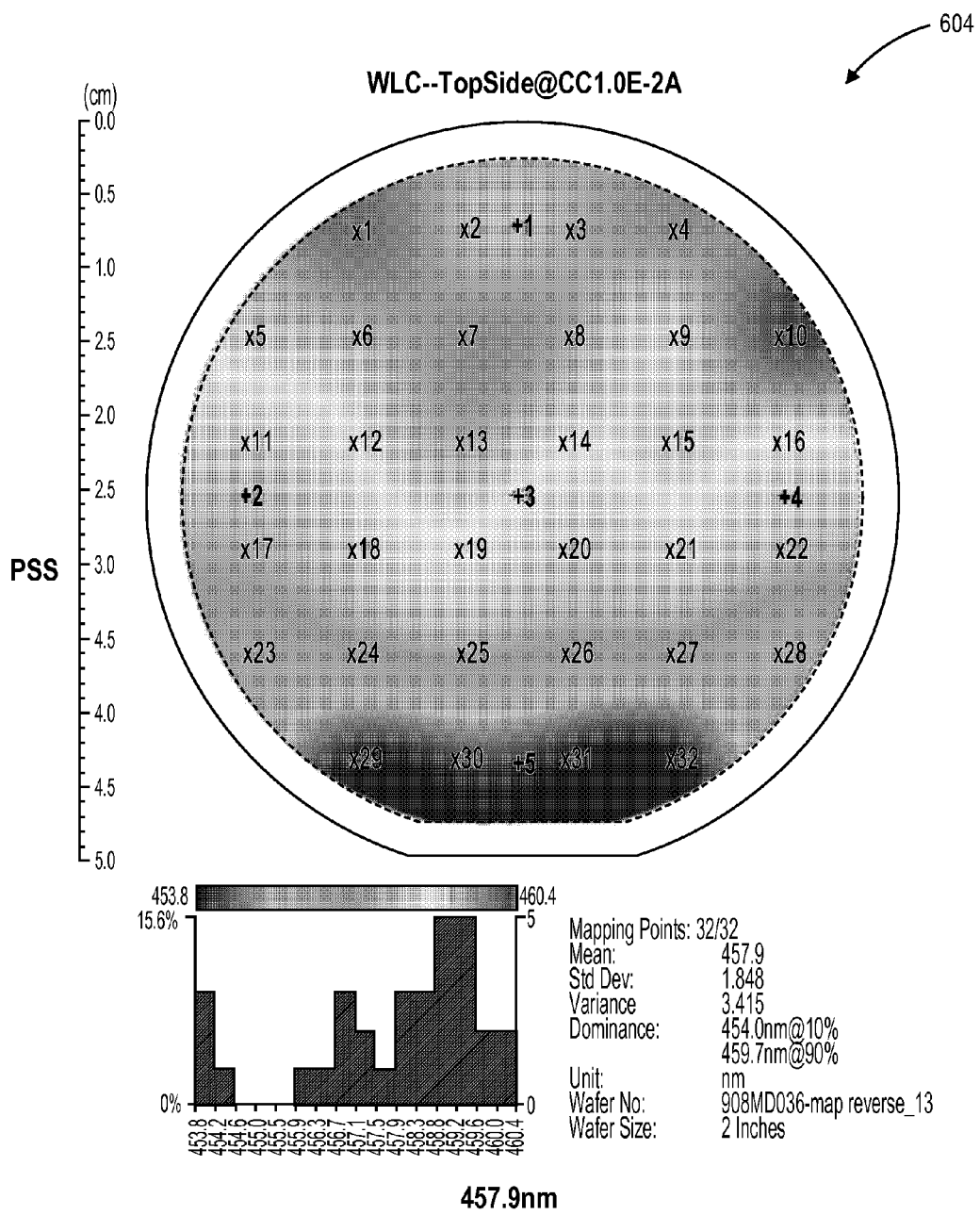
Figure 6F:
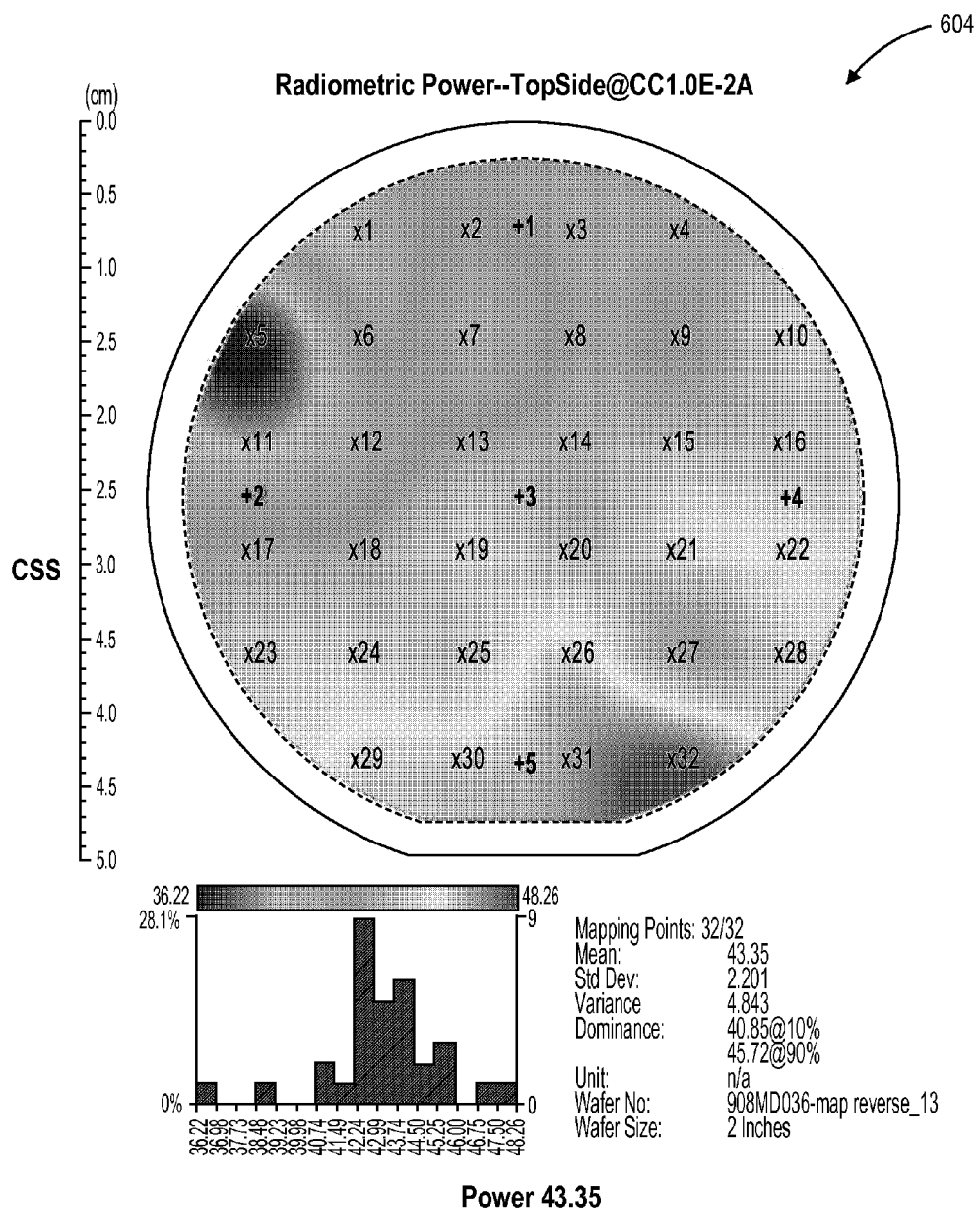

FIG. 4 illustrates image and plot grouping 402, 404 and 406 of surface measurements as well as recovery process times for epitaxy of gallium nitride on a patterned sapphire substrate, in accordance with an embodiment of the present invention. Referring to FIG. 4(a), a typical slow recovery case is observed on a conventional sapphire substrate (CSS). For example, the reflectance dips further during the roughening stage until coalescence takes over. The recovery or coalescence takes more than 1000 seconds, which is shown from the optical reflectance when the oscillation starts. However, referring to FIGS. 4(b) and 4(c), for growth on a patterned sapphire substrate (PSS), the recovery stage is fast (less than 500 seconds) by the enhanced lateral growth along [112-0] or [101-0]. As a result, the growth on CSS with these fast recovery conditions gives a large value of FWHM for the (102) plane. Meanwhile, the gallium nitride (GaN) grown on the PSS shows pit-free smooth surfacing and excellent crystal quality. In a particular embodiment, carrier mobility for the GaN layer on PSS is more than 500 cm2/V·s. Furthermore, in accordance with an embodiment of the present invention, cross-section scanning electron microscope (SEM) images reveal fewer voids along the sapphire and the GaN interface for formation on a pyramid-patterned substrate, as depicted in images 502 and 504 of FIG. 5.

FIGS. 6A-6F depict map groupings 602 and 604 a comparison of EL and PL for light emitting diodes (LEDs) grown on conventional sapphire substrates (CSS) and patterned sapphire substrates (PSS), respectively, in accordance with an embodiment of the present invention. Referring to FIGS. 6A-6F, the EL power and PL intensity on PSS shows a 3-4 times increase over that for CSS. Thus, in one embodiment, a LED is grown using both the GaN templates on PSS and CSS, wherein the LED on PSS shows significant increase in the PL intensity and EL radiometric power, and less reverse leakage current, as compared with the CSS counterpart.

In an exemplary embodiment, a first recipe favoring lateral growth is performed at a higher temperatures (30-50 degrees Celsius higher), with an N2 rich carrier gas, at a lower pressure (<100 Torr), with a low (<2000) V/III ratio, and with the addition of magnesium. A second recipe, that follows the first recipe, favoring vertical growth is performed at a lower temperature, with an H2 rich carrier gas, at a higher pressure (>100 Torr), with a high (>2000) V/III ratio, and with no addition of magnesium.

An example of an MOCVD deposition chamber which may be utilized for methods of epitaxy of gallium nitride, and other such related films, and light emitting diodes on patterned sapphire substrates, and other such related substrates, may be provided. For example, FIG. 7 is a schematic cross-sectional view of an MOCVD chamber according to an embodiment of the invention.

Figure 7:
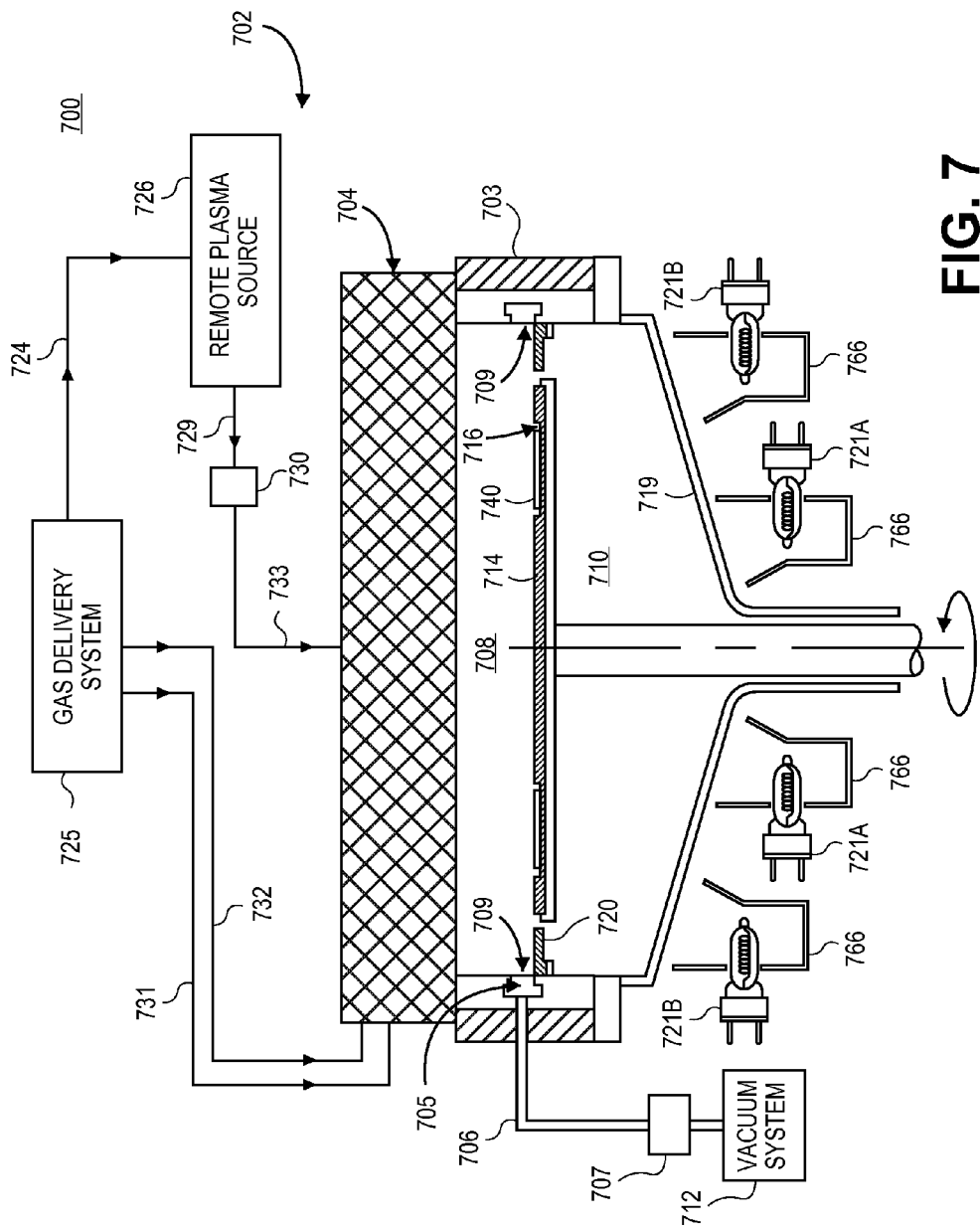
FIG. 7 is a schematic cross-sectional view of an MOCVD chamber, in accordance with an embodiment of the present invention

The apparatus 700 shown in FIG. 7 includes a chamber 702, a gas delivery system 725, a remote plasma source 726, and a vacuum system 712. The chamber 702 includes a chamber body 703 that encloses a processing volume 708. A showerhead assembly 704 is disposed at one end of the processing volume 708, and a substrate carrier 714 is disposed at the other end of the processing volume 708. A lower dome 719 is disposed at one end of a lower volume 710, and the substrate carrier 714 is disposed at the other end of the lower volume 710. The substrate carrier 714 is shown in process position, but may be moved to a lower position where, for example, the substrates 740 may be loaded or unloaded. An exhaust ring 720 may be disposed around the periphery of the substrate carrier 714 to help prevent deposition from occurring in the lower volume 710 and also help direct exhaust gases from the chamber 702 to exhaust ports 709. The lower dome 719 may be made of transparent material, such as high-purity quartz, to allow light to pass through for radiant heating of the substrates 740. The radiant heating may be provided by a plurality of inner lamps 721A and outer lamps 721B disposed below the lower dome 719, and reflectors 766 may be used to help control chamber 702 exposure to the radiant energy provided by inner and outer lamps 721A, 721B. Additional rings of lamps may also be used for finer temperature control of the substrate 740.

The substrate carrier 714 may include one or more recesses 716 within which one or more substrates 740 may be disposed during processing. The substrate carrier 714 may carry six or more substrates 740. In one embodiment, the substrate carrier 714 carries eight substrates 740. It is to be understood that more or less substrates 740 may be carried on the substrate carrier 714. Typical substrates 740 may include sapphire, silicon carbide (SiC), silicon, or gallium nitride (GaN). It is to be understood that other types of substrates 740, such as glass substrates 740, may be processed. Substrate 740 size may range from 50 mm-100 mm in diameter or larger. The substrate carrier 714 size may range from 200 mm-750 mm. The substrate carrier 714 may be formed from a variety of materials, including SiC or SiC-coated graphite. It is to be understood that substrates 740 of other sizes may be processed within the chamber 702 and according to the processes described herein. The showerhead assembly 704 may allow for more uniform deposition across a greater number of substrates 740 and/or larger substrates 740 than in traditional MOCVD chambers, thereby increasing throughput and reducing processing cost per substrate 740.

The substrate carrier 714 may rotate about an axis during processing. In one embodiment, the substrate carrier 714 may be rotated at about 2 RPM to about 100 RPM. In another embodiment, the substrate carrier 714 may be rotated at about 30 RPM. Rotating the substrate carrier 714 aids in providing uniform heating of the substrates 740 and uniform exposure of the processing gases to each substrate 740.

The plurality of inner and outer lamps 721A, 721B may be arranged in concentric circles or zones (not shown), and each lamp zone may be separately powered. In one embodiment, one or more temperature sensors, such as pyrometers (not shown), may be disposed within the showerhead assembly 704 to measure substrate 740 and substrate carrier 714 temperatures, and the temperature data may be sent to a controller (not shown) which can adjust power to separate lamp zones to maintain a predetermined temperature profile across the substrate carrier 714. In another embodiment, the power to separate lamp zones may be adjusted to compensate for precursor flow or precursor concentration non-uniformity. For example, if the precursor concentration is lower in a substrate carrier 714 region near an outer lamp zone, the power to the outer lamp zone may be adjusted to help compensate for the precursor depletion in this region.

The inner and outer lamps 721A, 721B may heat the substrates 740 to a temperature of about 400 degrees Celsius to about 1200 degrees Celsius. It is to be understood that the invention is not restricted to the use of arrays of inner and outer lamps 721A, 721B. Any suitable heating source may be utilized to ensure that the proper temperature is adequately applied to the chamber 702 and substrates 740 therein. For example, in another embodiment, the heating source may include resistive heating elements (not shown) which are in thermal contact with the substrate carrier 714.

A gas delivery system 725 may include multiple gas sources, or, depending on the process being run, some of the sources may be liquid sources rather than gases, in which case the gas delivery system may include a liquid injection system or other means (e.g., a bubbler) to vaporize the liquid. The vapor may then be mixed with a carrier gas prior to delivery to the chamber 702. Different gases, such as precursor gases, carrier gases, purge gases, cleaning/etching gases or others may be supplied from the gas delivery system 725 to separate supply lines 731, 732, and 733 to the showerhead assembly 704. The supply lines 731, 732, and 733 may include shut-off valves and mass flow controllers or other types of controllers to monitor and regulate or shut off the flow of gas in each line.

A conduit 729 may receive cleaning/etching gases from a remote plasma source 726. The remote plasma source 726 may receive gases from the gas delivery system 725 via supply line 724, and a valve 730 may be disposed between the showerhead assembly 704 and remote plasma source 726. The valve 730 may be opened to allow a cleaning and/or etching gas or plasma to flow into the showerhead assembly 704 via supply line 733 which may be adapted to function as a conduit for a plasma. In another embodiment, apparatus 700 may not include remote plasma source 726 and cleaning/etching gases may be delivered from gas delivery system 725 for non-plasma cleaning and/or etching using alternate supply line configurations to shower head assembly 704.

The remote plasma source 726 may be a radio frequency or microwave plasma source adapted for chamber 702 cleaning and/or substrate 740 etching. Cleaning and/or etching gas may be supplied to the remote plasma source 726 via supply line 724 to produce plasma species which may be sent via conduit 729 and supply line 733 for dispersion through showerhead assembly 704 into chamber 702. Gases for a cleaning application may include fluorine, chlorine or other reactive elements.

In another embodiment, the gas delivery system 725 and remote plasma source 726 may be suitably adapted so that precursor gases may be supplied to the remote plasma source 726 to produce plasma species which may be sent through showerhead assembly 704 to deposit CVD layers, such as III-V films, for example, on substrates 740.

A purge gas (e.g., nitrogen) may be delivered into the chamber 702 from the showerhead assembly 704 and/or from inlet ports or tubes (not shown) disposed below the substrate carrier 714 and near the bottom of the chamber body 703. The purge gas enters the lower volume 710 of the chamber 702 and flows upwards past the substrate carrier 714 and exhaust ring 720 and into multiple exhaust ports 709 which are disposed around an annular exhaust channel 705. An exhaust conduit 706 connects the annular exhaust channel 705 to a vacuum system 712 which includes a vacuum pump (not shown). The chamber 702 pressure may be controlled using a valve system 707 which controls the rate at which the exhaust gases are drawn from the annular exhaust channel 705.

Figure 8:
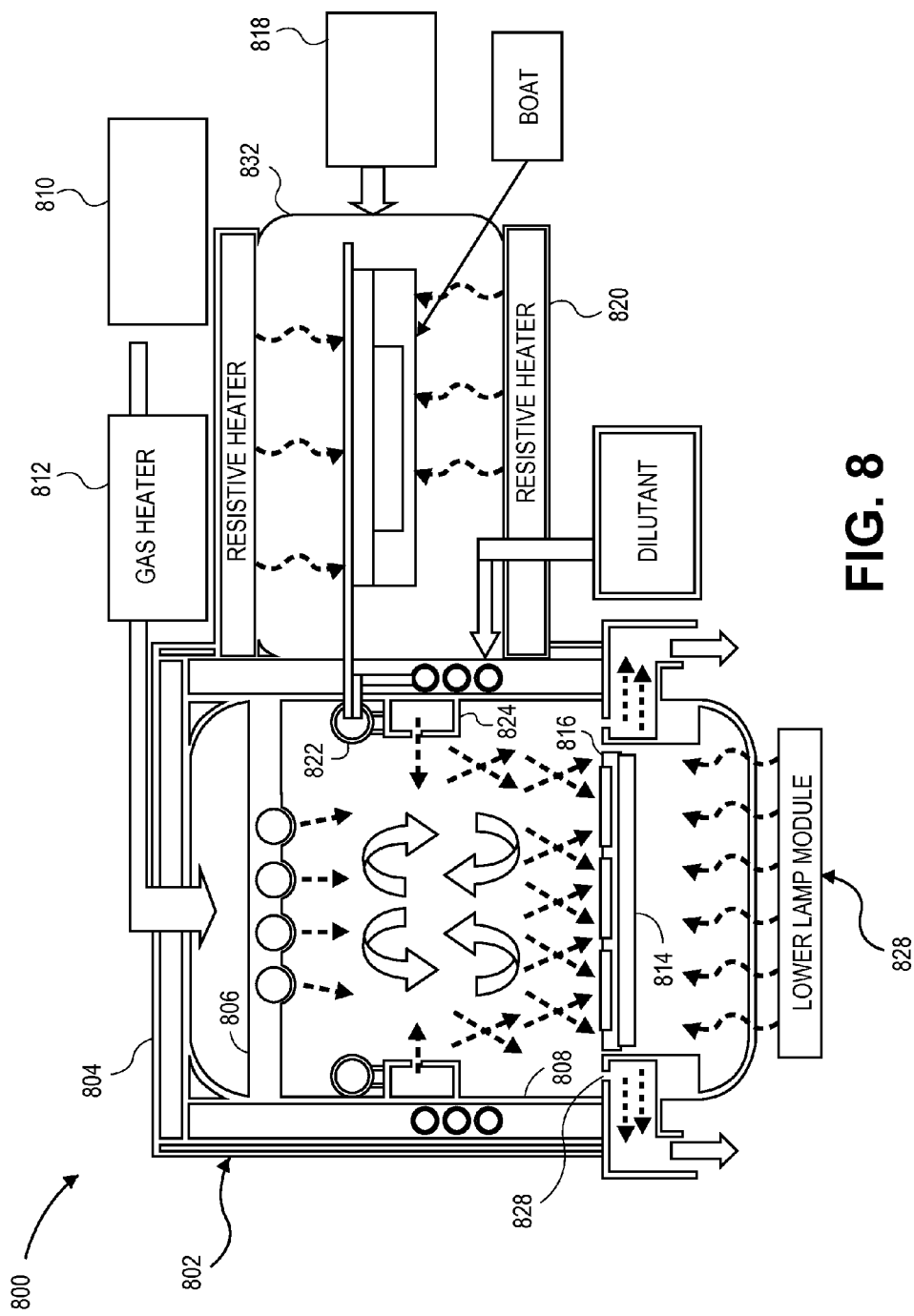
FIG. 8 is a schematic view of an HVPE apparatus, in accordance with an embodiment of the present invention.

An HVPE deposition chamber may instead be utilized for methods of epitaxy of gallium nitride, and other such related films, and light emitting diodes on patterned sapphire substrates, and other such related substrates, in accordance with embodiments of the present invention. For example, FIG. 8 is a schematic view of an HVPE apparatus 800 according to one embodiment.

The apparatus 800 includes a chamber 802 enclosed by a lid 804. Processing gas from a first gas source 810 is delivered to the chamber 802 through a gas distribution showerhead 806. In one embodiment, the gas source 810 includes a nitrogen containing compound. In another embodiment, the gas source 810 includes ammonia. In one embodiment, an inert gas such as helium or diatomic nitrogen is introduced as well either through the gas distribution showerhead 806 or through the walls 808 of the chamber 802. An energy source 812 may be disposed between the gas source 810 and the gas distribution showerhead 806. In one embodiment, the energy source 812 includes a heater. The energy source 812 may break up the gas from the gas source 810, such as ammonia, so that the nitrogen from the nitrogen containing gas is more reactive.

To react with the gas from the first source 810, precursor material may be delivered from one or more second sources 818. The precursor may be delivered to the chamber 802 by flowing a reactive gas over and/or through the precursor in the precursor source 818. In one embodiment, the reactive gas includes a chlorine containing gas such as diatomic chlorine. The chlorine containing gas may react with the precursor source to form a chloride. In order to increase the effectiveness of the chlorine containing gas to react with the precursor, the chlorine containing gas may snake through the boat area in the chamber 832 and be heated with the resistive heater 820. By increasing the residence time that the chlorine containing gas is snaked through the chamber 832, the temperature of the chlorine containing gas may be controlled. By increasing the temperature of the chlorine containing gas, the chlorine may react with the precursor faster. In other words, the temperature is a catalyst to the reaction between the chlorine and the precursor.

In order to increase the reactivity of the precursor, the precursor may be heated by a resistive heater 820 within the second chamber 832 in a boat. The chloride reaction product may then be delivered to the chamber 802. The reactive chloride product first enters a tube 822 where it evenly distributes within the tube 822. The tube 822 is connected to another tube 824. The chloride reaction product enters the second tube 824 after it has been evenly distributed within the first tube 822. The chloride reaction product then enters into the chamber 802 where it mixes with the nitrogen containing gas to form a nitride layer on a substrate 816 that is disposed on a susceptor 814. In one embodiment, the susceptor 814 includes silicon carbide. The nitride layer may include n-type gallium nitride for example. The other reaction products, such as nitrogen and chlorine, are exhausted through an exhaust 826.

A group III-V material layer fabricated on a patterned substrate may be used in the fabrication of a light-emitting diode device. For example, FIG. 9 illustrates a cross-sectional view of a gallium nitride (GaN)-based light-emitting diode (LED), in accordance with an embodiment of the present invention.

Figure 9:
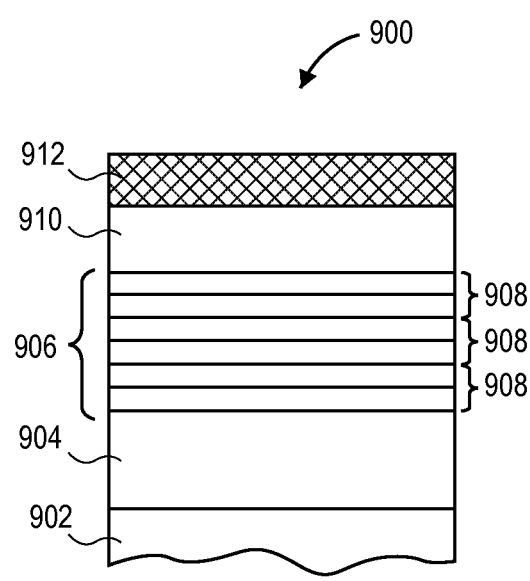
FIG. 9 illustrates a cross-sectional view of a gallium nitride (GaN)-based light-emitting diode (LED), in accordance with an embodiment of the present invention.

Referring to FIG. 9, a GaN-based LED 900 includes an n-type GaN template 904 (e.g., n-type GaN, n-type InGaN, n-type AlGaN, n-type InAlGaN) on a substrate 902 (e.g., planar sapphire substrate, patterned sapphire substrate (PSS), silicon substrate, silicon carbide substrate). The GaN-based LED 900 also includes a multiple quantum well (MQW), or active region, structure or film stack 906 on or above the n-type GaN template 904 (e.g., an MQW composed of one or a plurality of field pairs of InGaN well/GaN barrier material layers 908, as depicted in FIG. 9). The GaN-based LED 900 also includes a p-type GaN (p-GaN) layer or film stack 910 on or above the MQW 906, and a metal contact or ITO layer 912 on the p-GaN layer.

LEDs and related devices may be fabricated from layers of, e.g., group III-V films, especially group III-nitride films. Some embodiments of the present invention relate to forming gallium nitride (GaN) layers in a dedicated chamber of a fabrication tool, such as in a dedicated MOCVD chamber. In some embodiments of the present invention, GaN is a binary GaN film, but in other embodiments, GaN is a ternary film (e.g., InGaN, AlGaN) or is a quaternary film (e.g., InAlGaN). In at least some embodiments, the group III-nitride material layers are formed epitaxially. They may be formed directly on a substrate or on a buffers layer disposed on a substrate.

It is to be understood that embodiments of the present invention are not limited to formation of layers on patterned sapphire substrates. Other embodiments may include the use of any suitable patterned single crystalline substrate upon which a Group III-V, such as a Group III-Nitride, epitaxial film may be formed. The patterned substrate may be formed from a substrate, such as but not limited to a sapphire ($Al_2O_3$) substrate, a silicon carbide (SiC) substrate, a silicon on diamond (SOD) substrate, a quartz ($SiO_2$) substrate, a glass substrate, a zinc oxide (ZnO) substrate, a magnesium oxide (MgO) substrate, and a lithium aluminum oxide ($LiAlO_2$) substrate. Any well know method, such as masking and etching may be utilized to form features, such as the posts described above, from a planar substrate to create a patterned substrate. In a specific embodiment, however, the patterned substrate is a (0001) patterned sapphire substrate (PSS). Patterned sapphire substrates may be ideal for use in the manufacturing of LEDs because they increase the light extraction efficiency which is extremely useful in the fabrication of a new generation of solid state lighting devices.

It is also to be understood that embodiments of the present invention need not be limited to GaN as a group III-V layer formed on a patterned substrate. For example, other embodiments may include any Group III-Nitride epitaxial film that can be suitably deposited by hydride vapor phase epitaxy or MOCVD, or the like, deposition. The Group III-Nitride film may be a binary, ternary, or quaternary compound semiconductor film formed from a group III element or elements selected from gallium, indium and aluminum and nitrogen. That is, the Group III-Nitride crystalline film can be any solid solution or alloy of one or more Group III element and nitrogen, such as but not limited to GaN, AlN, InN, AlGaN, InGaN, InAlN, and InGaAlN. In a specific embodiment, the Group III-Nitride film is a gallium nitride (GaN) film. The Group III-Nitride film can have a thickness between 2-500 microns and is typically formed between 2-15 microns. Thicknesses greater than 500 microns are possible because of, e.g., the high growth rate of HVPE. In an embodiment of the present invention, the Group III-Nitride film has a thickness of at least 3.0 microns to sufficiently suppress threading dislocations. Additionally, the Group III-Nitride film can be doped or undoped. The Group III-Nitride film can be p-typed doped using any p type dopant such as but not limited Mg, Be, Ca, Sr, or any Group I or Group II element have two valence electrons. The Group III-Nitride film can be p type doped to a conductivity level of between $1 \times 10^{16}$ to $1 \times 10^{20}$ atoms/cm$^3$. The Group III-Nitride film can be n type doped using any n type dopant such as but not limited to Si, Ge, Sn, Pb, or any suitable Group IV, Group V, or Group VI element. The Group III-Nitride film can be n type doped to a conductivity level of between $1 \times 10^{16}$ to $1 \times 10^{20}$ atoms/cm$^3$.

Thus, methods of epitaxy of gallium nitride, and other such related films, and light emitting diodes on patterned sapphire substrates, and other such related substrates, have been disclosed. In accordance with an embodiment of the present invention, a pit free, high mobility, and improved crystal quality gallium nitride layer is formed on a patterned sapphire substrate. In accordance with an embodiment of the present invention, pit free, high mobility, and improved crystal group III-V layer is disposed on a patterned substrate. In one embodiment, the substrate is a patterned sapphire substrate and the group III-V layer is a gallium nitride layer.

What is claimed is:

1. A semiconductor device, comprising:
    a patterned sapphire substrate having a plurality of discrete pyramids thereon, each pyramid having approximately the same dimensions, wherein the spacing between pyramids correlates with the diameter of each pyramid; and
    a group III-V material disposed on the patterned sapphire substrate, continuous between and on each of the discrete pyramids, wherein the group III-V material has a lateral dimension in alignment with a [112-0] or a [101-0] plane of the patterned sapphire substrate and a vertical dimension in alignment with a [0001] plane of the patterned sapphire substrate.

2. The semiconductor device of claim 1, wherein the spacing between pyramids is approximately the same as the diameter of each pyramid.

3. The semiconductor device of claim 2, wherein the height of each pyramid is approximately 1 micron.

4. The semiconductor device of claim 1, wherein the group III-V material comprises a pit free, high mobility, gallium nitride layer.

5. The semiconductor device of claim 4, wherein the gallium nitride layer has a mobility greater than approximately 500 cm2N·s.

* * * * *